(12) United States Patent
Liu

(10) Patent No.: US 12,362,516 B2
(45) Date of Patent: Jul. 15, 2025

(54) DUSTPROOF FRAME AND DUSTPROOF SYSTEM

(71) Applicants: INVENTEC (PUDONG) TECHNOLOGY CORPORATION, Shanghai (CN); INVENTEC CORPORATION, Taipei (TW)

(72) Inventor: Ming Tsung Liu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 305 days.

(21) Appl. No.: 18/208,712

(22) Filed: Jun. 12, 2023

(65) Prior Publication Data

US 2024/0297458 A1   Sep. 5, 2024

(30) Foreign Application Priority Data

Mar. 3, 2023  (CN) .......................... 202310201292.4

(51) Int. Cl.
 *H01R 13/52*  (2006.01)
(52) U.S. Cl.
 CPC ................... *H01R 13/5213* (2013.01)
(58) Field of Classification Search
 None
 See application file for complete search history.

(56) References Cited

U.S. PATENT DOCUMENTS

| 10,440,852 B1 * | 10/2019 | Shearman | H05K 7/20709 |
| 2014/0345238 A1 * | 11/2014 | Jun | B01D 46/0004 55/385.4 |
| 2015/0077935 A1 * | 3/2015 | Wright | H05K 7/1491 248/65 |

FOREIGN PATENT DOCUMENTS

WO   WO-2017182857 A1 *  10/2017   ........... H05K 7/1491

* cited by examiner

*Primary Examiner* — Tho D Ta
(74) *Attorney, Agent, or Firm* — Maschoff Brennan

(57) ABSTRACT

A dustproof frame is disposed on a server, wherein at least one cable is plugged into the server. The dustproof frame includes a cable management assembly and a filter assembly. The cable management assembly is configured to be disposed one the server. The cable management assembly surrounds and forms an air channel. The air channel is configured to accommodate the at least one cable. The cable management assembly has at least one wire outlet. The at least one wire outlet is located at a central portion of the air channel and is in fluid communication with the air channel. The at least one wire outlet is configured for the at least one cable to pass through. The filter assembly is detachably disposed on the cable management assembly and covers a side of the air channel farthest away from the server.

6 Claims, 8 Drawing Sheets

DUSTPROOF FRAME AND DUSTPROOF SYSTEM

CROSS-REFERENCE TO RELATED APPLICATIONS

This non-provisional application claims priority under 35 U.S.C. § 119(a) on Patent Application No(s). 202310201292.4 filed in China, on Mar. 3, 2023, the entire contents of which are hereby incorporated by reference.

BACKGROUND OF THE INVENTION

Technical Field of the Invention

The invention relates to a dustproof frame and a dustproof system, more particularly to a dustproof frame and a dustproof system including the same.

Description of the Related Art

With the rapid development of technology, the performance of a server is enhanced, and electronic components in the server are becoming much more sophisticated. In order to prevent dust from entering the server to cause cables between the electronic components to be in poor connection, generally, a dustproof frame may be installed at a front side of the server to prevent dust from entering of the server.

However, the conventional dustproof frame is adjacently installed at the front side of the server. Thus, it is difficult for the conventional server to simultaneously meet the insertions of cables and the dustproof requirement. Specifically, when the cables are plugged into the server, the cables may occupy a space for the installation of the dustproof frame, such that the dustproof frame cannot be installed in such space. On the contrary, when the dustproof frame is installed on the server, the dustproof frame blocks cable ports of the server, such that the cables are unable to be plugged into the cable ports of the server. In order to solve this issue, some server manufacturer may directly remove the cable port. Therefore, how to easily install the dustproof frame and properly accommodate the cables plugged into the server is an important topics in this field.

SUMMARY OF THE INVENTION

The invention provides a dustproof frame and a dustproof system which meet the requirement of the convenience of the installation of the dustproof frame and properly accommodate the cables plugged into the server.

One embodiment of the invention provides a dustproof frame disposed on a server, wherein at least one cable is plugged into the server. The dustproof frame includes a cable management assembly and a filter assembly. The cable management assembly is configured to be disposed one the server. The cable management assembly surrounds and forms an air channel. The air channel is configured to accommodate the at least one cable. The cable management assembly has at least one wire outlet. The at least one wire outlet is located at a central portion of the air channel and is in fluid communication with the air channel. The at least one wire outlet is configured for the at least one cable to pass through. The filter assembly is detachably disposed on the cable management assembly and covers a side of the air channel farthest away from the server.

According to the dustproof frame and the dustproof system disclosed by above embodiments, since the cable management assembly having the wire outlets is additionally disposed between the filter assembly and the server, so that the cables plugged into the server can be accommodated in the air channel located in the cable management assembly, and the cables can penetrate through the wire outlets without blocking the space for mounting the dustproof frame. Thus, after the cables are plugged into the server, the operator may not be interfere by the cables so as to install the dustproof frame easier. Therefore, the convenience of mounting the dustproof frame can be improved via the cable management assembly, and the cables plugged into the server can be properly accommodated.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

Figure 1:
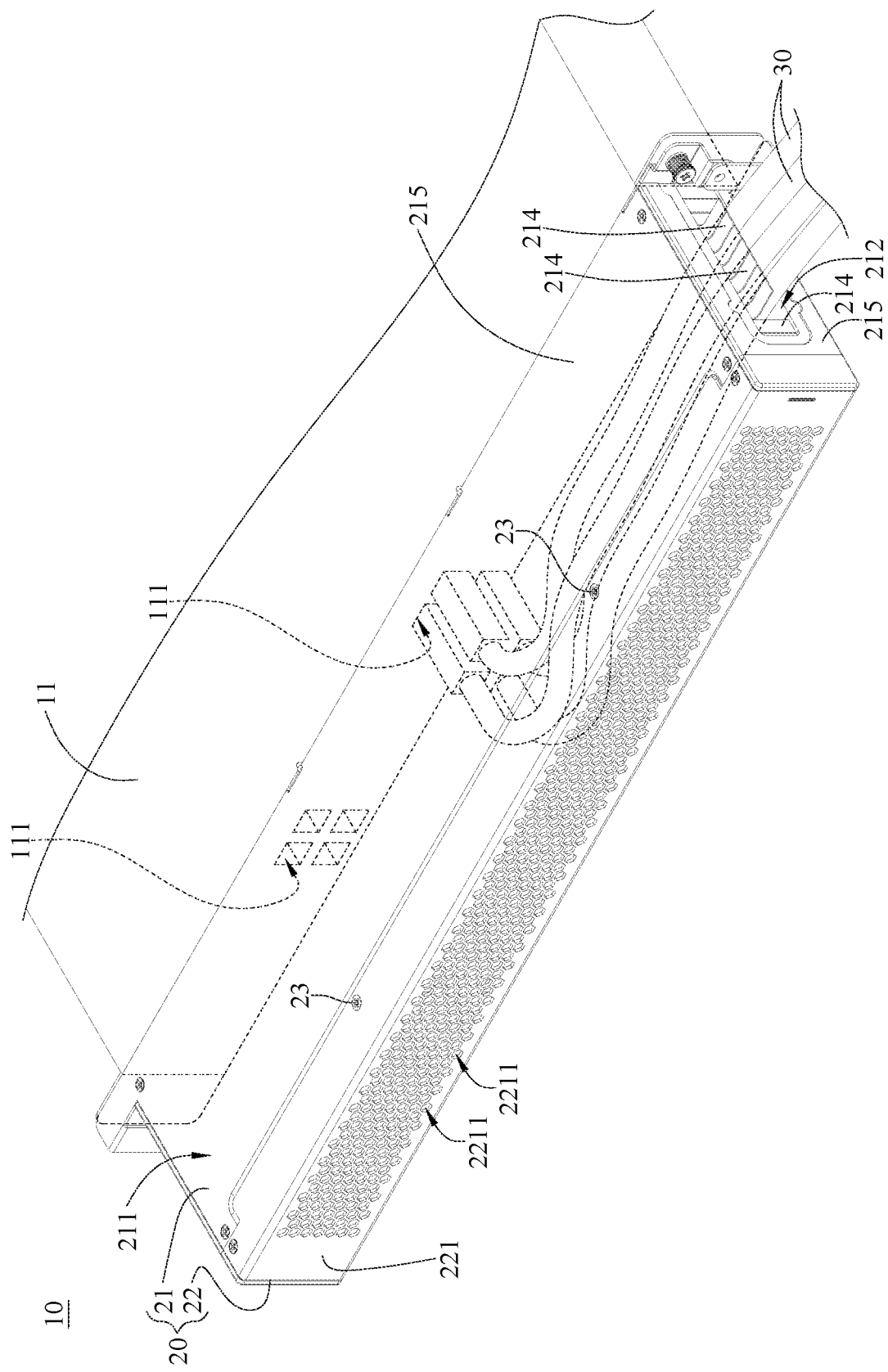
FIG. 1 is a perspective view of a dustproof system in accordance with one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
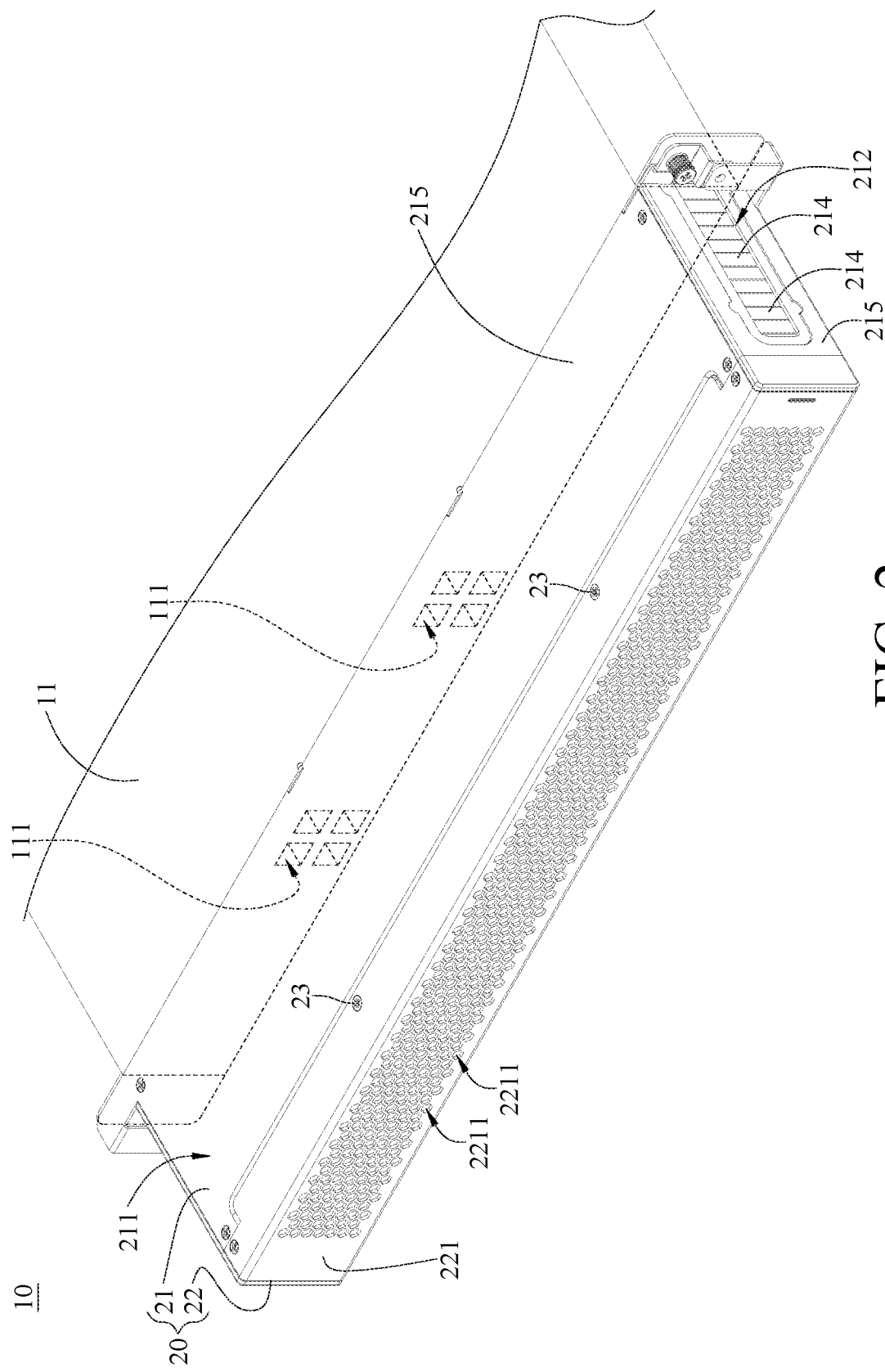
FIG. 2 is a perspective view of a server without cables in FIG. 1.
Figure 3:
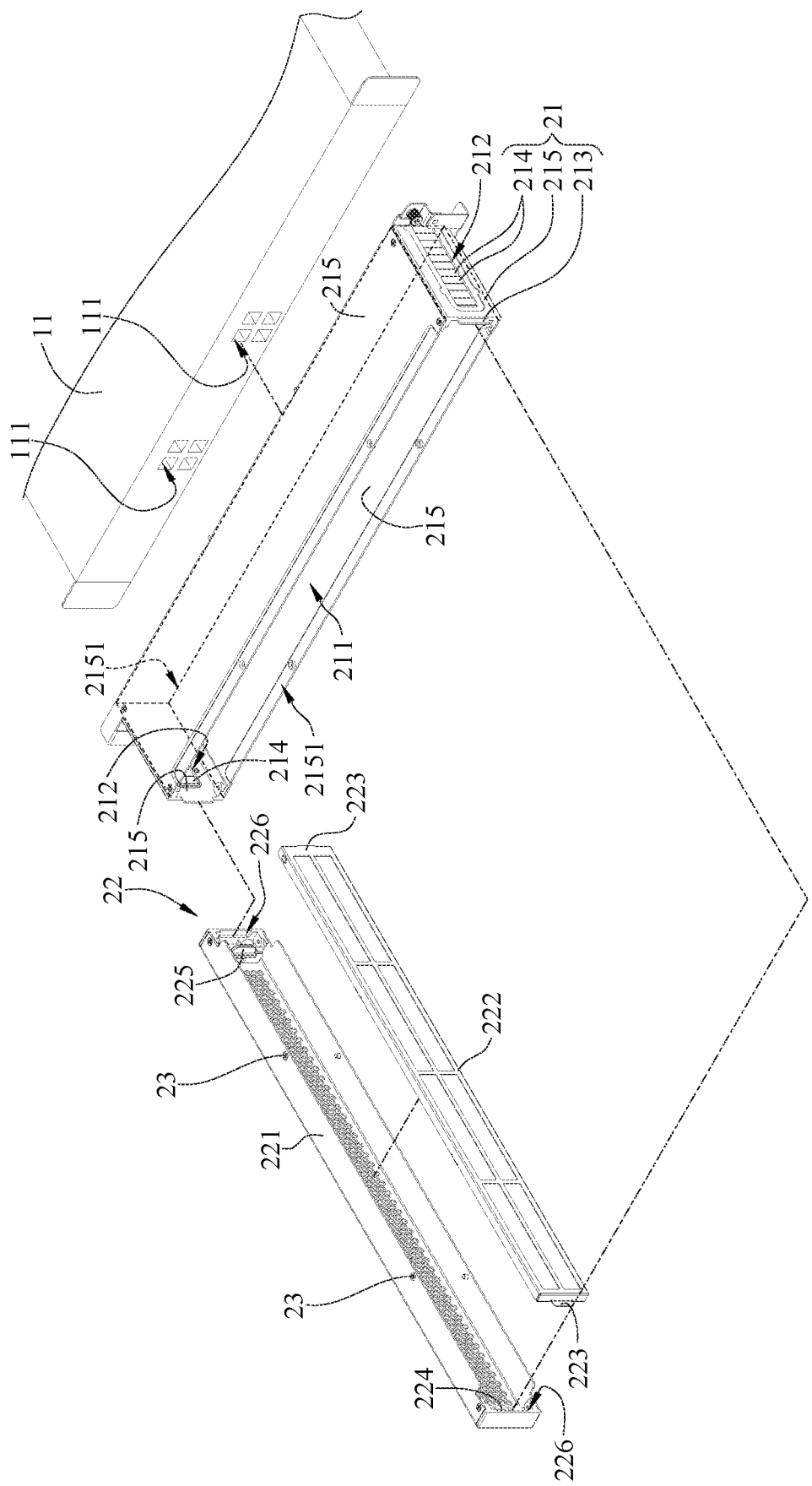
FIG. 3 is an exploded view of the server without the cables in FIG. 2.

Please refer to FIG. 1 to FIG. 3, where FIG. 1 is a perspective view of a dustproof system 10 in accordance with one embodiment of the invention, FIG. 2 is a perspective view of a server 11 without cables 30 in FIG. 1, and FIG. 3 is an exploded view of the server 11 without the cables 30 in FIG. 2.

In this embodiment, the dustproof system 10 includes a server 11 and a dustproof frame 20. The server 11 has a plurality of ports 111 for a plurality of cables 30 to be plugged therein. The dustproof frame 20 includes a cable management assembly 21 and a filter assembly 22. The cable management assembly 21 is configured to be mounted on the server 11. The cable management assembly 21 includes four side plates 215 and has two wire outlets 212. The four side plates 215 surround and form an air channel 211. The air channel 211 is configured to accommodate the cables 30. Two opposite sides of the four side plates 215 respectively surround and form two openings 2151, and the two openings 2151 are in fluid communication with the air channel 211. A side of the server 11 is located at one of the two openings 2151. The two wire outlets 212 are located at two of the four side plates 215 located opposite to each other and located at a central portion of the air channel 211, and are in fluid communication with the air channel 211. The two wire outlets 212 are configured for the cables 30 to penetrate therethrough. The filter assembly 22 includes a mounting body 221 and a filter member 222. The mounting body 221 is detachably disposed on the cable management assembly 21, and the mounting body 221 has a plurality of through holes 2211. The filter member 222 is detachably disposed on the mounting body 221 located closest to a side of the air channel 211, and covers the through holes 2211. The filter assembly 22 is located at the other one of the two openings 2151, and covers a side of the air channel 211 located farthest away from the server 11. That is, the cable management assembly 21 is disposed at a side of the server 11, the filter assembly 22 is detachably disposed at a side of the cable management assembly 21 located farthest away from the server 11, and the cable management assembly 21 surrounds and forms the air channel 211 to accommodate the cables 30. In addition, the cable management assembly 21, for example, has the two wire outlets 212. The two wire outlets 212 are in fluid communication with the air channel 211, and are configured for the cables 30 to penetrate therethrough.

In this embodiment, the arrangement of the two wire outlets 212 of the cable management assembly 21 additionally disposed between the filter assembly 22 and the server 11 enables that the cables 30 plugged into the server 11 can be accommodated in the air channel 211 located in the cable management assembly 21, and the cables 30 can penetrate through the two wire outlets 212. Thus, the cables 30 do not occupy a space for the installation of the dustproof frame 20 and interfere the installation of the dustproof frame 20. Therefore, the convenience of the installation of the dustproof frame 20 can be improved via the cable management assembly 21 disposed at a side of the server 11, and the cables 30 plugged into the server 11 can be properly accommodated.

In this embodiment, the filter member 222 is disposed on a side of the mounting body 221 located closest to the air channel 211, such that the filter member 222 can filter the dust to prevent the dust from entering the server 11, and the filter member 222 is prevented from being accidentally touched by an operator for avoiding the filter member 222 to be detached from the mounting body 221.

In this embodiment, the dustproof frame 20 may further includes a plurality of fasteners 23, the cable management assembly 21 may further has two protrusion portions 213, and the filter assembly 22 may further has two recess portions 226. The fasteners 23, for example, are screws. The two protrusion portions 213 are located at two ends of the cable management assembly 21, respectively, and the two recess portions 226 are located at two ends of the filter assembly 22, respectively. The two protrusion portions 213 of the cable management assembly 21 are mounted into the two recess portions 226 of the filter assembly 22, and then the cable management assembly 21 and the filter assembly 22 are fastened to each other via the fasteners 23. Since the filter assembly 22 is detachably disposed on the cable management assembly 21, it is convenient for the operator to disassemble the filter assembly 22 from the cable management assembly 21 to replace the filter member 222 with another.

Figure 4:
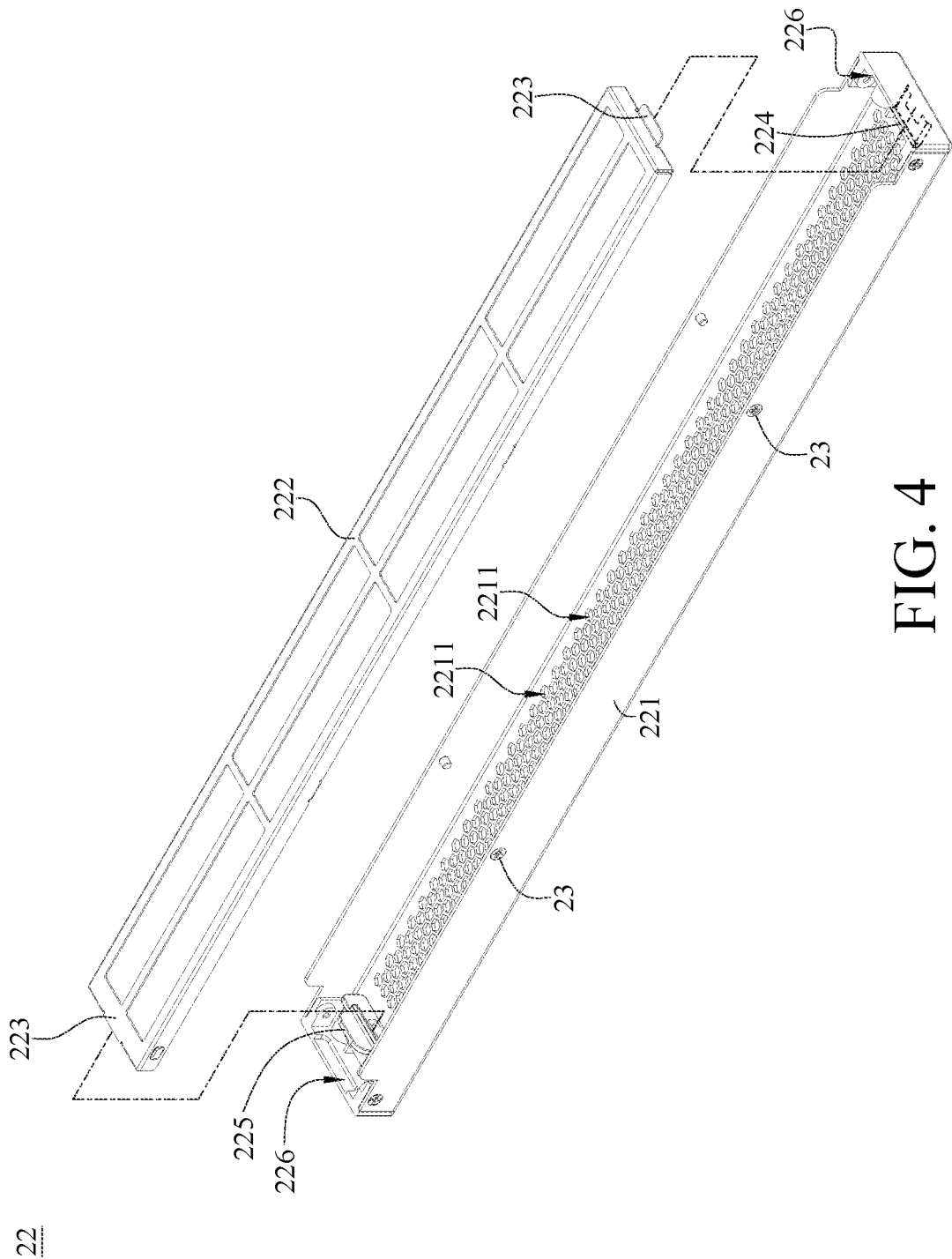
FIG. 4 is an exploded view of a filter assembly in FIG. 1.
Figure 5:
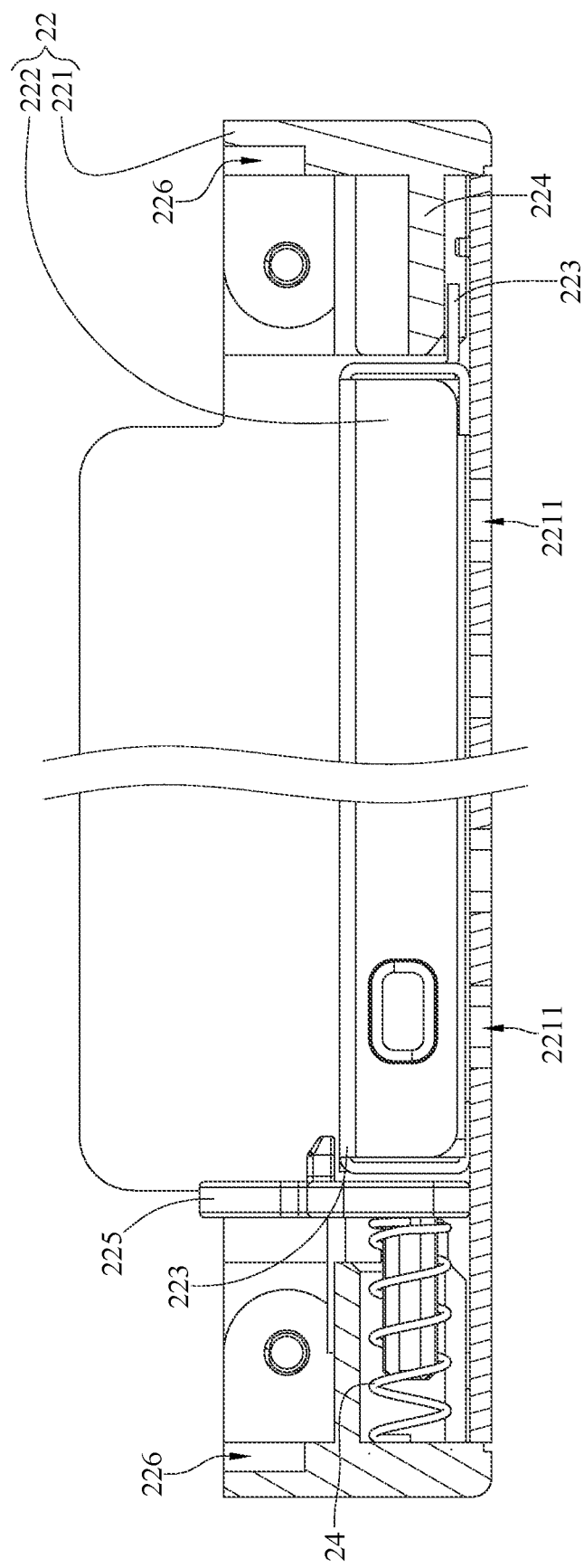
FIG. 5 is a cross-sectional view of the filter assembly in FIG. 1.

Please refer to FIG. 4 and FIG. 5, where FIG. 4 is an exploded view of the filter assembly 22 in FIG. 1, and FIG. 5 is a cross-sectional view of the filter assembly 22 in FIG. 1.

In this embodiment, the filter member 222 of the filter assembly 22 is detachably disposed on the mounting body 221. The filter assembly 22 may further include two engagement portions 223, a fixed engagement member 224 and a movable engagement member 225. The two engagement portions 223 are located at two opposite sides of the filter member 222, respectively. The fixed engagement member 224 is located at one side of the mounting body 221, and the movable engagement member 225 is slidably located at another side of the mounting body 221. The two engagement portions 223 are protrusions, and the fixed engagement member 224 and the movable engagement member 225 are recesses matching the protrusions, respectively. The two engagement portions 223 are engaged with the fixed engagement member 224 and the movable engagement member 225, respectively. One of the two engagement portions 223 is firstly engaged with the fixed engagement member 224, and then another one of the two engagement portions 223 is engaged with the movable engagement member 225 by sliding the movable engagement member 225 for completing the engagement between the filter assembly 22 and the cable management assembly 21.

In this embodiment, the filter assembly 22 may further include a restoring member 24. The restoring member 24 is, for example, a spring. Two ends of the restoring member 24 are connected to the mounting body 221 and the movable engagement member 225, respectively. Accordingly, the restoring member 24 can be compressed by the movable engagement member 225 for yielding a space for the filter member 222 to be placed therein, and then the restoring member 24 is released to force the movable engagement member 225 to be engaged with one of the two engagement portions 223.

In this embodiment, the cable management assembly 21 may further include a plurality of flexible covering members 214. The flexible covering members 214 are, for example, rubber films. A side of each of the flexible covering members 214 is disposed on the side plate 215 having the wire outlet 212, and the flexible covering member 214 are swingable relative to the cable management assembly 21 to cover the two wire outlets 212 or expose a part of the two wire outlets 212. That is, when there is no cable 30 penetrating through the two wire outlets 212, the flexible covering members 214 covers the two wire outlets 212. When the cables 30 penetrate through the two wire outlets 212, the flexible covering members 214 expose parts of the two wire outlets 212.

Figure 6:
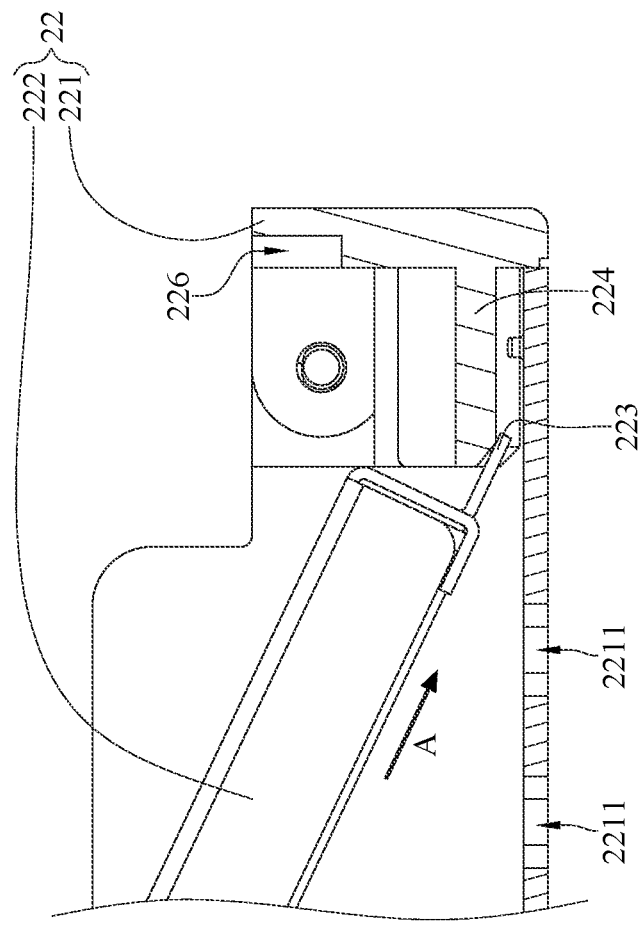
FIG. 6 is a cross-sectional view showing an installation of one side of a filter member in accordance with one embodiment of the invention.
Figure 7:
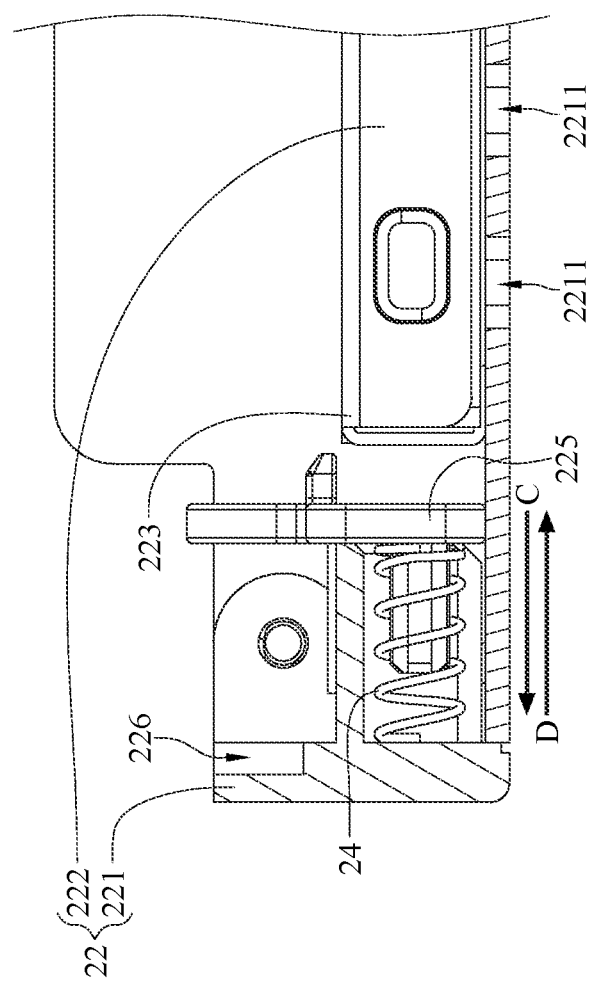
FIG. 7 is a cross-sectional view showing an installation of another side of the filter member in accordance with one embodiment of the invention.
Figure 8:
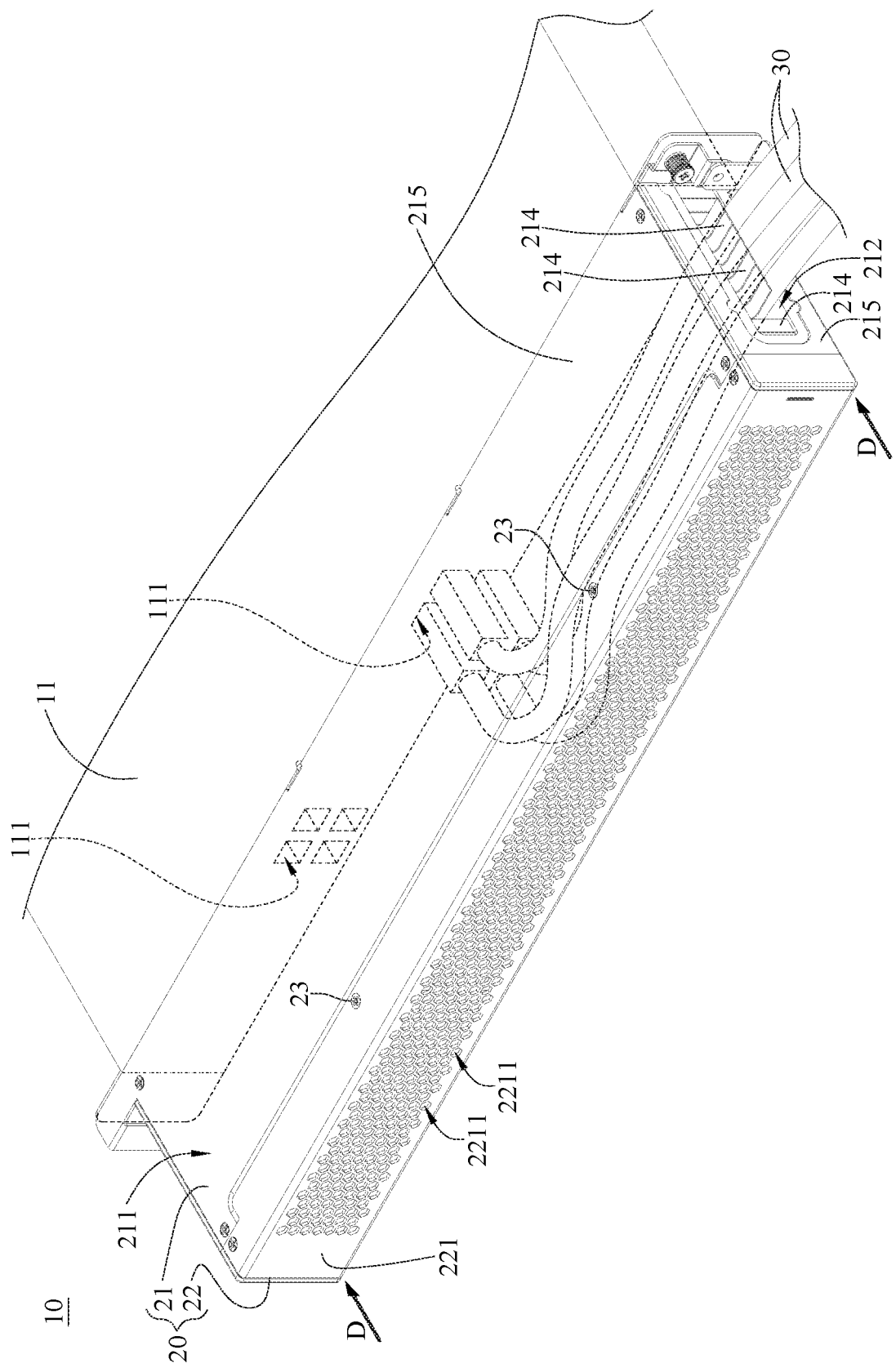
FIG. 8 is a perspective view showing that an installation of the filter assembly in accordance with one embodiment of the invention.

Please refer to FIG. 6 to FIG. 8, where FIG. 6 is a cross-sectional view showing an installation of one side of the filter member 222 in accordance with one embodiment of the invention, FIG. 7 is a cross-sectional view showing an installation of another side of the filter member 222 in accordance with one embodiment of the invention, and FIG. 8 is a perspective view showing an installation of the filter assembly 22 in accordance with one embodiment of the invention.

In this embodiment, during the installation of the filter member 222 on the mounting body 221, one of the two engagement portions 223 of the filter member 222 is firstly engaged with the fixed engagement member 224 along a direction A. Then, the movable engagement member 225 is pressed along a direction B, so that the restoring member 24 is compressed by the movable engagement member 225 to yield a space for the filter member 222 to be placed. Then, the movable engagement member 225 is released, so that the restoring member 24 forces the movable engagement member 225 to move along a direction C, and thus the other one of the two engagement portions 223 of the filter member 222 is engaged with the movable engagement member 225. As a result, the installation of the filter member 222 on the mounting body 221 is finished.

In this embodiment, after the filter member 222 of the filter assembly 22 is mounted on the mounting body 221, the installation of the filter assembly 22 on the cable management assembly 21 is performed. During the installation of the filter assembly 22 on the cable management assembly 21, the two protrusion portions 213 of the cable management assembly 21 are mounted into the two recess portions 226 of the filter assembly 22 along a direction D. Then, the cable management assembly 21 and the filter assembly 22 are fastened to each other via the fasteners 23. Accordingly, the installation of the filter assembly 22 on the cable management assembly 21 is finished.

In this embodiment, there are two wire outlets 212, and the two wire outlets 212 are located on two of the four side plates 215 located opposite to each other, but the invention is not limited thereto. In other embodiments, the cable management assembly may include only one wire outlet or more wire outlets, which may be located at one of the four side plates or side plates of the four side plates which are adjacent to one another.

In this embodiment, each end of the cable manager assembly 21 has one protrusion portion 213, and each end of the filter assembly 22 has one recess portion 226, but the present invention is not limited thereto. In other embodiments, each end of the cable manager assembly may have more than one protrusion portions, and each end of the filter assembly may have more than one recess portion.

In this embodiment, the cable manager assembly 21 has the protrusion portions 213, and the filter assembly 22 has the recess portions 226, but the present invention is not limited thereto. In other embodiments, the cable manager assembly may have the recess portions, and the filter assembly may have the protrusion portions.

In this embodiment, the filter assembly 22 includes one restoring member 24, but the present invention is not limited thereto. In other embodiments, the filter assembly may include two or more restoring members.

In this embodiment, the cable management assembly 21 includes multiple flexible covering members 214, but the present invention is not limited thereto. In other embodiments, the cable management assembly may include only one flexible covering member.

In this embodiment, the server 11 of the present invention can be applied to artificial intelligence (AI) computing, edge computing, and can also be used as a 5G server, a cloud server or a Vehicles Internet server.

According to the dustproof frame and the dustproof system disclosed by above embodiments, since the cable management assembly having the wire outlets is additionally disposed between the filter assembly and the server, so that the cables plugged into the server can be accommodated in the air channel located in the cable management assembly, and the cables can penetrate through the wire outlets without occupying the space for the installation of the dustproof frame. Thus, after the cables are plugged into the server, the operator may not be interfered by the cables so as to install the dustproof frame easier. Therefore, the convenience of the installation of the dustproof frame can be improved via the cable management assembly, and the cables plugged into the server can be properly accommodated.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:

1. A dustproof frame, disposed on a server, wherein at least one cable is plugged into the server, and the dustproof frame comprises:
a cable management assembly, configured to be disposed on the server, wherein the cable management assembly surrounds and forms an air channel, the air channel is configured to accommodate the at least one cable, the cable management assembly has at least one wire outlet, the at least one wire outlet is located at a central portion of the air channel and is in fluid communication with the air channel, and the at least one wire outlet is configured for the at least one cable to penetrate therethrough; and
a filter assembly, detachably disposed on the cable management assembly and covering a side of the air channel located farthest away from the server:
wherein the filter assembly further comprises a mounting body and a filter member, the mounting body is detachably disposed on the cable management assembly, and the filter member is disposed on the mounting body:
wherein the filter assembly further comprises two engagement portions, a fixed engagement member and a movable engagement member, the two engagement portions are located at two opposite sides of the filter member, respectively, the fixed engagement member is located at one side of the mounting body, the movable engagement member is slidably located at another side of the mounting body, the two engagement portions are protrusions, the fixed engagement member and the movable engagement member are recesses matching the protrusions, respectively, and the two engagement portions are engaged with the fixed engagement member and the movable engagement member, respectively.

2. The dustproof frame according to claim 1, wherein the filter assembly further comprises at least one restoring member, two ends of the restoring member are connected to the mounting body and the movable engagement member, respectively.

3. The dustproof frame according to claim 1, wherein the cable management assembly further comprises four side plates, the four side plates surround and form the air channel, two opposite sides of the four side plates surround and form two openings, respectively, the two openings are in fluid communication with the air channel, a side of the server is located at one of the two openings, the filter assembly is located at the other one of the two openings, and the at least one wire outlet is located at one of the four side plates.

4. The dustproof frame according to claim 3, wherein the cable management assembly further comprises at least one flexible covering member, a side of the at least one flexible covering member is disposed on the one of the four side plates where the at least one wire outlet is located, and the at least one flexible covering member is swingable relative to the cable management assembly to cover the at least one wire outlet or partially expose the at least one wire outlet.

5. A dustproof system, comprising:
  a server, wherein at least one cable is plugged into the server;
  a cable management assembly, configured to be disposed on the server, wherein the cable management assembly surrounds and forms an air channel, the air channel is configured to accommodate the at least one cable, the cable management assembly has at least one wire outlet, the at least one wire outlet is located at a central portion of the air channel and is in fluid communication with the air channel, and the at least one wire outlet is configured for the at least one cable to penetrate therethrough; and
  a filter assembly, detachably disposed on the cable management assembly and covering a side of the air channel located farthest away from the server;
  wherein the filter assembly further comprises a mounting body and a filter member, the mounting body is detachably disposed on the cable management assembly, and the filter member is disposed on the mounting body;
  wherein the filter assembly further comprises two engagement portions, a fixed engagement member and a movable engagement member, the two engagement portions are located at two opposite sides of the filter member, respectively, the fixed engagement member is located at one side of the mounting body, the movable engagement member is slidably located at another side of the mounting body, the two engagement portions are protrusions, the fixed engagement member and the movable engagement member are recesses matching the protrusions, respectively, and the two engagement portions are engaged with the fixed engagement member and the movable engagement member, respectively.

6. The dustproof system according to claim 5, wherein the cable management assembly further comprises four side plates and at least one flexible covering member, the four side plates surround and form the air channel, two opposite sides of the four side plates surround and form two openings, respectively, the two openings are in fluid communication with the air channel, a side of the server is located at one of the two openings, the filter assembly is located at the other one of the two openings, the at least one wire outlet is located at one of the four side plates, a side of the at least one flexible covering member is disposed on the one of the four side plates where the at least one wire outlet is located, and the at least one flexible covering member is swingable relative to the cable management assembly to cover the at least one wire outlet or partially expose the at least one wire outlet.

* * * * *